United States Patent [19]
Dein et al.

[11] Patent Number: 5,744,403
[45] Date of Patent: Apr. 28, 1998

[54] DIELECTRIC FILM DEPOSITION METHOD AND APPARATUS

[75] Inventors: Edward Alan Dein, Horsham; Michael Douglas Gross, Allentown; Richard Allen Pudliner, Whitehall, all of Pa.

[73] Assignee: Lucent Technologies Inc., Murray Hill, N.J.

[21] Appl. No.: 719,699

[22] Filed: Jun. 25, 1991

Related U.S. Application Data

[63] Continuation of Ser. No. 401,369, Aug. 31, 1989, abandoned.

[51] Int. Cl.⁶ ................................................ H01L 21/02
[52] U.S. Cl. .......................... 438/761; 427/574; 427/579; 427/9; 156/345 PW; 118/728; 438/788
[58] Field of Search .................................. 437/225, 228, 437/238; 427/38, 39, 41

[56] References Cited

U.S. PATENT DOCUMENTS

| | | | |
|---|---|---|---|
| 4,058,638 | 11/1977 | Morton | 427/39 |
| 4,242,188 | 12/1980 | Niinomi et al. | 427/41 |
| 4,436,761 | 3/1984 | Hayashi et al. | 427/39 |
| 4,492,736 | 1/1985 | Tanner | 427/39 |
| 4,681,653 | 7/1987 | Purdes et al. | 117/102 |
| 4,732,761 | 3/1988 | Machida et al. | 437/238 |
| 4,872,947 | 10/1989 | Wang et al. | 156/643 |

FOREIGN PATENT DOCUMENTS

| | | |
|---|---|---|
| 0251650 | 6/1987 | European Pat. Off. . |
| 0251650 | 1/1988 | European Pat. Off. . |
| 0367004 | 10/1989 | European Pat. Off. . |
| 0367004 | 5/1990 | European Pat. Off. . |
| 0048139 | 5/1981 | Japan . |
| 56-48139 | 7/1981 | Japan . |
| 0192032 | 11/1982 | Japan . |
| 57-192032 | 2/1983 | Japan . |
| 0181865 | 10/1983 | Japan . |
| 58-181865 | 1/1984 | Japan . |

OTHER PUBLICATIONS

Takamatsu, A. et al. "Plasma–Activated Deposition and Properties of Phosphosilicate Glass Film", 1046 Journal of the Electrochemical Society 131 (1984) Aug., No. 8, Manchester, New Hampshire, USA pp. 1865–1870.

Sze, S., VLSI Technology, p. 107–108, McGraw–Hill, 1983.

Takamatsu, "Plasma–Activated Deposition and Properties of Phosphosilicate Glass film," Jour. of Electrochem. Soc., 131, No. 8, Aug. 1984, pp. 1865–1870.

Primary Examiner—Nam Nguyen
Assistant Examiner—Anita Alanko
Attorney, Agent, or Firm—John T. Rehberg

[57] ABSTRACT

Dielectric layers comprising a silicon oxide and having essentially constant thickness across a wafer are produced by a plasma-deposition method; in preferred processing, a wafer is supported on a surface which extends significantly past the edge of the wafer. Resulting layers may be further processed by localized etching of windows or vias, uniform layer thickness being particularly beneficial, when timed etching is used, to ensure uniformity of etched openings.

13 Claims, 1 Drawing Sheet

DIELECTRIC FILM DEPOSITION METHOD AND APPARATUS

This application is a continuation of application Ser. No. 07/401,369, filed on Aug. 31, 1989, now abandoned.

TECHNICAL FIELD

The invention is concerned with the deposition of dielectric films or layers on semiconductor wafers in the manufacture of integrated-circuit semiconductor devices.

BACKGROUND OF THE INVENTION

In the manufacture of integrated-circuit semiconductor devices a number of different material layers are sequentially formed and processed on a substrate which typically takes the form of a wafer several inches in diameter. Among layer materials are conductor, semiconductor, and dielectric materials, and prominent among the latter are materials comprising a silicon oxide such as, e.g., silicon dioxide or a borosilicate, phosphosilicate, or borophosphosilicate glass. Such dielectric layers may be included, e.g., as passivating layers, as electrically insulating layers between conductor layers, or as cap layers on doped semiconductor layers, included to limit dopant migration in the course of layer processing.

Highly efficient, for forming silicon oxide layers, is a plasma deposition method in which tetraethylorthosilicate (TEOS, tetraethoxysilane) is used as a reactant with oxygen. This method involves placing a semiconductor wafer on a supporting stage in plasma-deposition apparatus, producing a gas flow including TEOS and oxygen, and applying a suitable radio-frequency voltage between electrodes to both sides of the wafer. Conveniently, the supporting stage also serves as an electrode, with a perforated gas-inlet plate further serving as a facing electrode.

Among desiderata with respect to deposited dielectric layers are high density and uniformity of composition, as well as uniformity of thickness. The latter is of particular importance where, for the sake of establishing electrical connections through windows or vias, timed etching will be used to form localized openings across the thickness of a deposited layer.

SUMMARY OF THE INVENTION

Dielectric layers comprising a silicon oxide and having essentially constant thickness across a wafer are produced by a plasma-deposition method; in preferred processing, a wafer is supported on a surface which extends significantly past the edge of the wafer. Resulting layers may be further processed by localized etching of windows or vias, uniform layer thickness being particularly beneficial, when timed etching is used, to ensure uniformity of etched openings.

DETAILED DESCRIPTION

Figure 1:
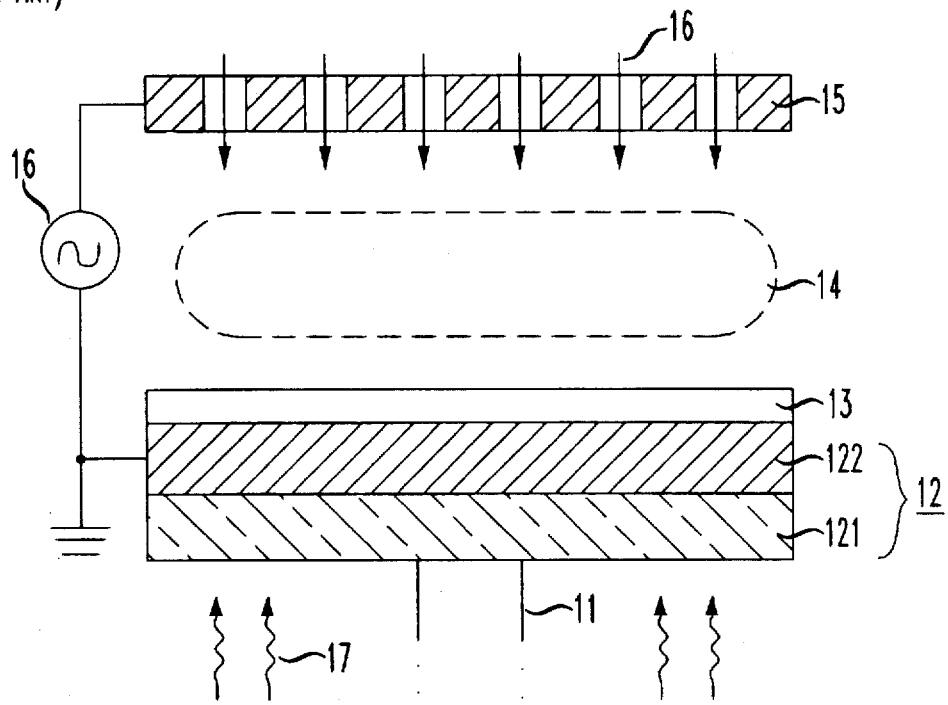
FIG. 1 is a schematic cross-sectional view of a portion of plasma deposition apparatus being used in prior-art processing.
Figure 2:
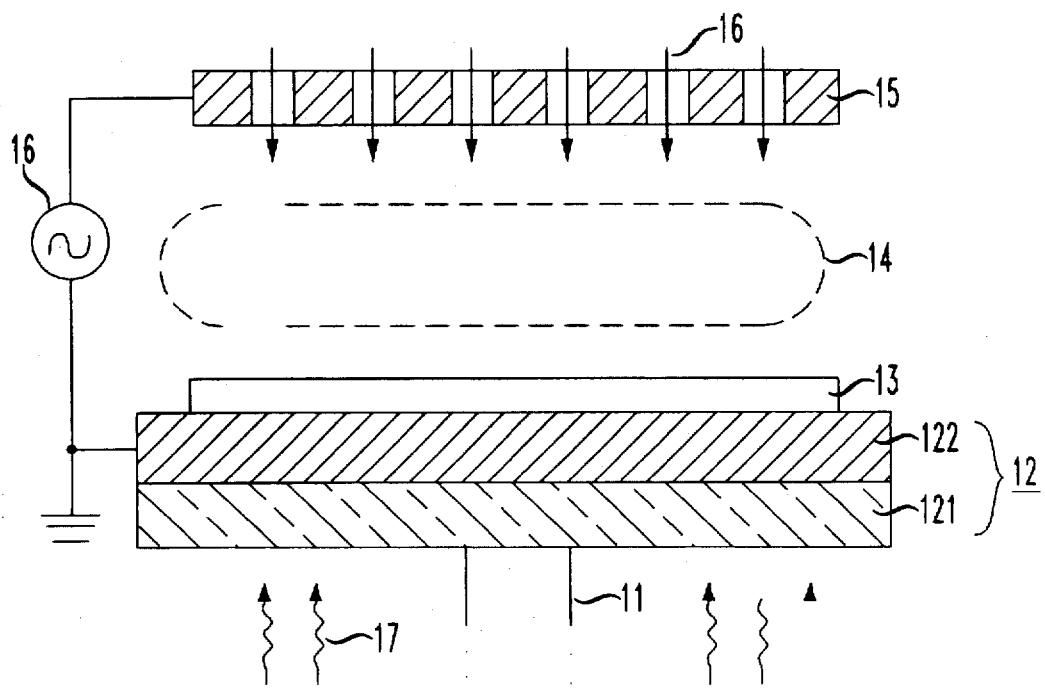
FIG. 2 is a schematic cross-sectional view of a portion of exemplary plasma deposition apparatus being used in preferred processing in accordance with the invention.

FIG. 1 and 2 show support holder 11, wafer support 12 comprising a ceramic portion 121 and an anodized aluminum portion 122 serving as process ground plane, supported silicon wafer 13, deposition plasma 14, gas-inlet plate 15, reagent-gas stream 16, and radio-frequency power source 16. Radiative heat 17 is supplied to the deposition surface of wafer 13 via wafer support 12. Support 12 is essentially circular as viewed in the direction of gas flow; such support may also be termed "susceptor" (suspecting radiative heat 17 as typically provided from below). Among additional features of plasma-deposition apparatus are an hermetic enclosure, and loading, evacuation, and heating means—the latter typically in the form of heat lamps.

The preferred arrangement shown in FIG. 2 differs from the prior-art arrangement of FIG. 1 in that the wafer-supporting member has a diameter which is significantly larger than the diameter of the wafer. Preferably, for standard wafers having a diameter in the range from 4 to 8 inches, support diameter exceeds wafer diameter by at least 0.5 inch, and preferably by at least 1 inch. On the other hand, since very much larger diameters do not lead to further significant enhancement of uniformity of layer thickness, and in the interest of minimizing the amount of unproductive deposits on the susceptor, support diameter preferably does not exceed wafer diameter by more than 2 inches. Accordingly, since a wafer is placed essentially centered for plasma-deposition processing, a preferred wafer support extends from 0.25 to 1 inch beyond the edge of the wafer.

Dielectric layers of interest in connection with the invention comprise a silicon oxide, $SiO_x$, $0<x<2$, in a preferred amount of at least 50 molecular percent. More specifically with respect to reagent gases used for deposition, such gases may comprise TEOS and oxygen, as well as, optionally, precursor gases for the inclusion of further layer constituents such as, e.g., boron and/or phosphorus as may be desired in the deposition of glassy layers. For example, for boron, trimethyl borate (TMB) may be used, and trimethyl phosphite (TMP) for phosphorus. Furthermore, the use of silicon-oxide precursors other than TEOS is not precluded; among candidates suitable in this respect are diacetoxyditeriarybutoxysilane (DADBS), diacetoxydiisopropoxysilane (DADIS), and tritertiarybutoxyethoxysilane (TBES).

A key benefit of the invention, namely more uniform layer thickness as compared with prior-art processing, may be attributed to one or several factors, including more even temperature distribution across a wafer on account of extended susceptor mass beyond the wafer edge, and attendant reduced wafer-edge heat loss. Also, preferred larger-diameter support may lead to a more uniform, less turbulent flow pattern radially across the wafer, to increased gas residence time, and to a somewhat extended plasma region, resulting in more uniform deposition conditions across a wafer.

As a result of uniformity of layer thickness, layers produced in accordance with the invention are preferred especially where subsequent processing involves timed etching across the thickness of a layer as, e.g., in the formation of electrical contact windows or vias. (As well-understood in the art, such etching is in the presence of a photolithographically patterned mask layer on the dielectric layer.) More generally, wherever subsequent processing benefits from surface uniformity and flatness, the invention reduces or eliminates the need for a planarization step.

The preferred method is considered relatively insensitive to changes in the diameter of the reagent flow as determined primarily by the size of the gas-inlet element, and preferred use of a larger susceptor does not necessitate replacement of such element. Indeed, particularly preferred use of a larger-diameter susceptor in combination with a standard gas-inlet ("shower head") permits essentially unchanged use, as compared with prior-art processing, of other processing-parameter settings, thus permitting realization of preferred, more uniform layer thickness without extensive process modification and recalibration.

EXAMPLE

On separate 5-inch substrates, layers of silicon oxide were deposited over patterned layers of "metal 1"—by prior-art processing and by exemplary processing in accordance with the invention. Prior-art processing involved use of commercially available plasma deposition apparatus made by Applied Materials company and known as AMI-5000, comprising an arrangement as schematically depicted in FIG. 1. The reagent flow consisted essentially of TEOS entrained with helium as a carrier gas, together with oxygen. A Prometrix device was used to measure layer thickness across the wafer, and a 1 sigma variation of approximately 2.5 percent was found between a minimum at the center of the wafer, and a maximum which was found to be at a radial distance of approximately 2 inches from the center of the wafer. After replacement of the original 5-inch susceptor with a 6-inch susceptor (namely a part designated as "susceptor, nitride, 125 mm", Part No. 0010-09134), but without changing any other deposition parameters such as, e.g., flow composition, flow rate, flow diameter, chamber pressure, susceptor temperature, RF-power, and duration of the deposition operation, a silicon oxide layer was obtained with 1 sigma variation not exceeding approximately 0.5 percent across the wafer.

We claim:

1. In the manufacture of integrated-circuit semiconductor devices, a method for depositing a layer of silicon oxide material on a semiconductor wafer, having a first surface said method comprising:

exposing a first surface of said wafer to a plasma in a reactant flow, said flow being directed through a perforated gas inlet member at said first surface in a direction essentially perpendicular to said first surface, said perforated gas inlet member having a diameter; and CHARACTERIZED IN THAT said wafer is placed essentially concentrically on a supporting member having a second surface which significantly extends past the edge of said first surface, said supporting member having a diameter which is greater than the said diameter of said gas inlet member, whereby radial variations in the thickness of said layer are reduced.

2. The method of claim 1 in which said second surface extends past the edge of said first surface by at least 0.25 inch.

3. The method of claim 2 in which said second surface extends past the edge of said first surface by at least 0.5 inch.

4. The method of claim 1 in which said second surface extends past the edge of said first surface by not more than 1 inch.

5. The method of claim 1 in which said flow, as directed at said surface, has a diameter which is less than or equal to the diameter of said wafer.

6. The method of claim 5 in which the diameter of said flow is approximately 5 inches, and in which the diameter of said supporting member is approximately 6 inches.

7. The method of claim 1 in which said supporting member is heated by irradiation.

8. The method of claim 1, further comprising a step of timed etching of openings in said layer.

9. The method of claim 1 in which said flow comprises oxygen and tetraethylorthosilicate.

10. The method of claim 1 in which said silicon oxide material comprises at least 50 molecular percent of a silicon oxide.

11. The method of claim 1 in which said silicon oxide material comprises a borosilicate glass.

12. The method of claim 1 in which said silicon oxide material comprises a phosphosilicate glass.

13. The method of claim 1 in which said silicon oxide material comprises a borophosphosilicate glass.

* * * * *